United States Patent [19]

Bassi

[11] Patent Number: 5,002,492
[45] Date of Patent: Mar. 26, 1991

[54] LAMP-HOLDER TERMINAL BOARD FOR DOMESTIC ELECTRICAL APPLIANCES

[75] Inventor: Alberto Bassi, Turin, Italy

[73] Assignee: ITW Fastex Italia, S.p.A., Turin, Italy

[21] Appl. No.: 420,863

[22] Filed: Oct. 13, 1989

[30] Foreign Application Priority Data

Oct. 18, 1988 [IT] Italy .................. 53473/88[U]

[51] Int. Cl.$^5$ .............................. H01R 9/09
[52] U.S. Cl. ................... 439/56; 439/618; 439/908
[58] Field of Search ............. 439/56, 226, 230, 232, 439/558, 618, 908

[56] References Cited

U.S. PATENT DOCUMENTS 4,076,358 2/1978 Taormina et al. .............. 439/56
4,837,927 6/1989 Savage, Jr. .................... 439/56

OTHER PUBLICATIONS

Cinch Printed Circuit Socket Catalog CC-41, Mar., 1964, pp. 1,2 & 9-12.

Primary Examiner—Paula A. Bradley
Attorney, Agent, or Firm—Schwartz & Weinrieb

[57] ABSTRACT

A lamp-holder terminal board is described for domestic electrical appliances in general, and refrigerators or freezers in particular, comprising a plate-like body made from an electrically insulating material and delimited by means of a peripheral edge, and preferably of substantially rectangular form, and by means of a pair of opposite lateral faces, and an electrically conductive sheet embedded within the plate-like body and disposed parallel to the faces; the plate-like body is integrally provided with a peripherally projecting sleeve for housing a lamp and, in correspondence with the lateral faces, with a plurality of perforations and slots through some of which are disposed respective electrical terminals integrally formed with the sheet, together with respective L-shape bent blade connectors projecting laterally from the plate-like body along the peripheral edge thereof.

18 Claims, 1 Drawing Sheet

LAMP-HOLDER TERMINAL BOARD FOR DOMESTIC ELECTRICAL APPLIANCES

FIELD OF THE INVENTION

The present invention relates generally to a lamp-holder terminal board particularly adapted to be used upon domestic electrical appliances, and more particularly, to an integrated lamp-holder/thermostat holder/terminal board for refrigerators and freezers.

BACKGROUND OF THE INVENTION

For the purpose of reducing the production costs and the dimensions of the various appliance components, as well as to facilitate the assembly of refrigerator light fittings, it is known to utilize integrated terminal boards for simultaneously performing both the function of electrical connector and the function of supporting a lamp-holder and a thermostat. In particular it is known to utilize terminal boards formed by means of a plate-like body of plastic material within which is embedded an electrical circuit defined by means of a conductive sheet suitably shaped and cut and integrally provided with a common sleeve-like lamp-holder and a seat for slidably housing the control rod of the lamp switch, as well as connectors formed in such a way as to allow the attachment onto the terminal board, upon opposite sides, of the thermostat and the electrical wiring for supplying the thermostat and the lamp with electrical power.

This type of terminal board is, however, of complex construction, in particular as far as the lamp-holder portion is concerned.

OBJECT OF THE INVENTION

The object of the present invention is to provide a lamp-holder terminal board of the type described, which is easily and economically manufactured, and which has very small dimensions.

SUMMARY OF THE INVENTION

The foregoing and other objects are achieved by means of the present invention, which relates to a lamp-holder terminal board, in particular for domestic electrical appliances, of the type comprising a plate-like body made of an electrically insulating material delimited by means of a peripheral edge and by means of a pair of opposite lateral faces, an electrically conductive sheet shaped in such a way as to define an electrical circuit embedded within the interior of the plate-like body and lying parallel to the opposite lateral faces, lamp-holder means, a housing for slidable control means, and electrical connection means accessible from one of the opposite lateral faces, characterized by the fact that the lamp-holder means is defined by means of a lamp-holder sleeve integrally formed with and projecting peripherally from the plate-like body in correspondence with a perforation formed within the terminal board passing through the faces of the plate-like body and communicating with the interior of the said sleeve; the plate-like body being provided upon the opposite lateral faces with a plurality of windows formed in such a way as to expose respective first portions of the conductive sheet, which is integrally provided with a plurality of electrical terminals formed upon the first portions and laterally engageable through the windows, with respective first blade contacts projecting into the perforation and respective bent L-shaped blade connectors projecting laterally with respect to the plate-like body, from the peripheral edge thereof; the conductive sheet being sub-divided into sections which are electrically separated from one another by means of perforations formed upon respective second portions thereof and disposed in correspondence with respective through-holes formed within the plate-like body.

BRIEF DESCRIPTION OF THE DRAWINGS

For a better understanding of the invention a non-limitative description of an embodiment thereof is now given with reference to the attached drawings, in which like reference characters designate like or corresponding parts throughout the several views, and wherein.

DETAILED DESCRIPTION OF THE PREFERRED EMBODIMENT

Figure 1:
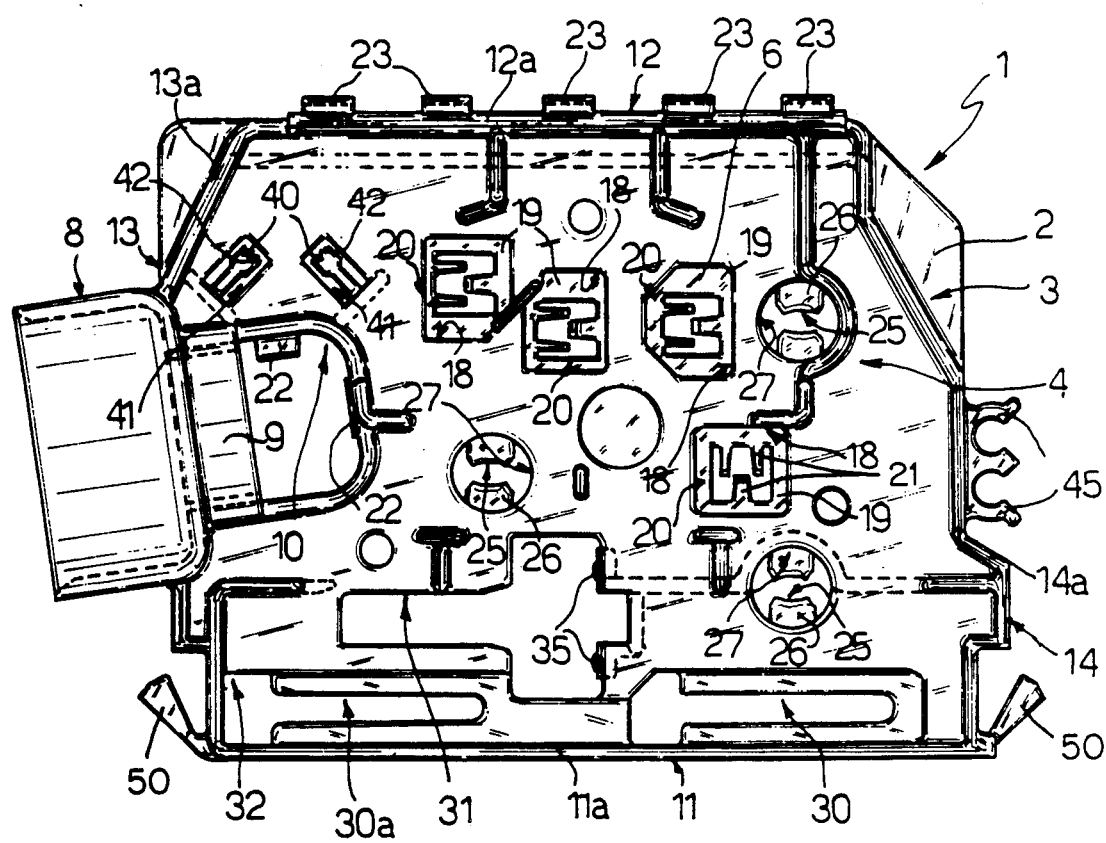
FIG. 1 is a longitudinal side view of a lamp-holder terminal board formed according to the present invention.
Figure 2:
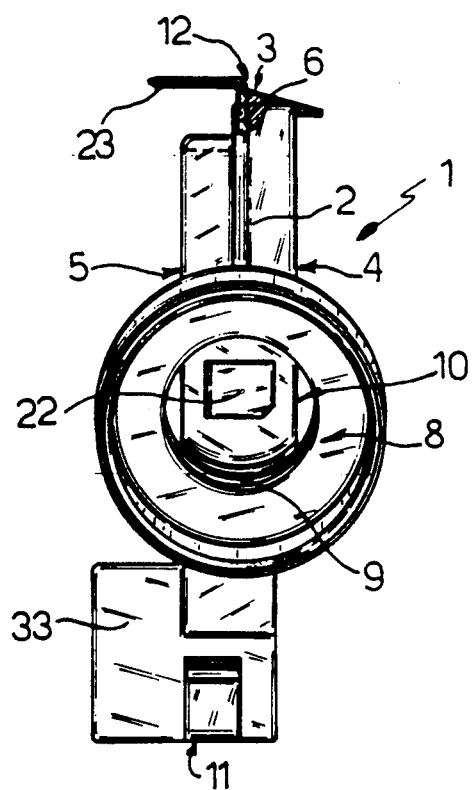
FIG. 2 is a front elevational view, partially sectioned at the upper part, of the lamp-holder terminal board of FIG. 1.

With reference to FIGS. 1 and 2, reference numeral 1 generally indicates an integrated lamp-holder terminal board, particualarly adapted to be used upon domestic electrical appliances such as, for example, refrigerators and freezers, for providing the appliance with a device for illumination and control of the various functions of the appliance, which can be assembled and wired easily and which is of small dimensions, the integrated lamp-holder terminal board including, as well as the terminal board per se, a lamp of any type, a push rod control switch, for the lamp, slidably supported against the action of a resilient means mounted upon the terminal board itself and adapted to cooperate in a known way with the door of the refrigerator or freezer so as to illuminate the lamp upon opening of the door itself, a thermostat of any type, provided with electrical connector feet of the blade or "Faston" type, and a plurality of female connectors of the "Faston" type preferably connected to a terminal strip or plug for connection of one or more electrical supply wires to the terminal board, all known and therefore not illustrated for simplicity.

The integrated terminal board 1 essentially comprises a plate-like body 2 made from an electrically insulating material, preferably a molded synthetic plastic resin, delimited by means of a peripheral edge 3 having a substantially rectangular outline and by means of a pair of opposite lateral faces 4, 5, and an electrically conductive sheet 6, such as for example made from a sheet of copper, brass or other appropriate alloy, embedded by means of co-molding the same into the body 2 parallel to the faces 4, 5 and shaped in a known way, by means of punching and folding, operations so as to define an overall electrical circuit of a known type, not illustrated for simplicity. The integrated terminal board 1 includes lamp-holder means defined by means of a cylindrical lamp-holder sleeve 8 provided with a rear end 9 having a smaller diameter and which is threaded internally and which is formed integrally with and projecting peripherally from the plate-like body 2 in correspondence with a substantially rectangular perforation 10 formed transversely through the integrated terminal board 1 so as to pass through the faces 4, 5 of the body 2 in a direction perpendicul thereto, in such a way as to communicate with the interior of the sleeve 8, and in particular with the rear end 9, which is defined by means of convex portions of the faces 4, 5 formed directly in correspondence with the perforation 10. It is seen that this structure, is formed coaxially with the sleeve 8 and is disposed, as is the latter, at an angle to the edge 3; in particular, sleeve 8 and perforation 10 are inclined towards a lower side 11 of the edge 3 defined by means of a first rib 11a disposed in relief with respect to the faces 4, 5. The remaining sides of the edge 3, respectively upper side 12, opposite and parallel to the side 11, front side 13 and rear side 14 are defined by means of respective ribs 12a, 13a and 14a all disposed in relief with respect to the faces 4, 5.

The plate-like body 2 is further provided through the faces 4, 5 with a plurality of windows 18 formed in such a way as to expose respective portions 19 of the conductive sheet 6 upon each region of which is integrally formed a respective electrical terminal 20 laterally engageable through means of the respective window 18, such as for example by means of the connector feet of a thermostat not illustrated; according to the invention there are a greater number of terminals 20 than the number of feet of the thermostat to be connected, disposed in positions such as to allow thermostats of different types and dimensions, among those normally employed, to be connected without modification to the same integrated terminal board 1, the number and arrangement of the windows 18 being such that there are terminals 20 found in all positions which may be occupied by the feet of any type of thermostat which may be used. For this purpose the terminals 20 are made in such a way as to have low cost, great ease of manufacture, and small size; in particular each terminal 20 comprises respective tongues 21 punched out from the portions 19 of the sheet 6 and bent obliquely out of the plane of the sheet 6, in particular so as to project with respect to the face 5 and in such a way as to converge in a V-shape so as to define upon the same side as the face 4 respective concavities into which the contact and support feet of a thermostat or other similar apparatus can be snap-inserted that is, such other apparatus or device, other than a thermostat, may be similarly mounted upon the integrated terminal board 1 in view of the fact that such other similar device will have similar contact and support feet.

The sheet 6 is further provided, in combination with the terminals 20, with respective blade contacts 22 of a known type which are formed upon the sheet 6 by means of punching and folding operations, projecting into the perforations 10, and with respective blade connectors 23 of a known type bent in an L-shape form from the face 5 and projecting laterally from the plate-like body 2 beyond the peripheral edge 3, and in particular are aligned side-by-side along the upper edge 12 so as to project laterally from the plate-like body 2 on the opposite side in the sense of engagement of the electrical terminals 20, and upon the same side as the face 5. The conductive sheet 6 is finally sub-divided in a known manner into electrically separate sections by means of perforations 25 formed on respective portions 26 thereof disposed in correspondence with respective through-holes 27 formed through the plate-like body 2.

The integrated terminal board 1 of the invention further includes a housing for a slidable lamp control means, that is for the push rod switch and associated biasing spring, defined by means of respective longitudinal T-shape slots 30 and 31 disposed parallel to one another, which are formed by passage through the integrated terminal board 1 in correspondence with the faces 4 and 5 of the body 2; there are two slots 30 formed in alignment one behind the other, parallel to the side 11 and extending along the same, in positions opposite the connectors 23; in particular, a first slot 30a is formed with its first end 32, of greater width, in correspondence with a shoulder wall 33 projecting laterally from the edge 3 at the corner formed by means of the sides 11 and 13; the slot 31 is on the other hand formed laterally of with respect to the slot 30a, and longitudinally off-set with respect thereto, and is internally provided with additional blade contacts 35 of a known type, integrally formed with the conductive sheet 6, again by punching and folding of parts thereof as was done in connection with the contacts 22.

Close to the sleeve 8 integrated terminal board 1 of the invention is further provided with a cable clamp defined by means of a pair of resiliently deformable inclined tongues 40 each projecting into a respective inclined slot 41 formed through the body 2 in such a way that respective free ends 42 of the tongues 40 converge towards one another in a direction away from the sleeve 8; the plate-like body 2 is finally provided, upon the side opposite sleeve 8 and projecting peripherally, with a support device for electrical cables comprising at least one half-ring 45 (in the illustrated example two half-rings 45) which are resiliently deformable and have a circumferential extent greater than 180°. Two resiliently deformable tongues 50 of a known type project from the opposite ends of the lower edge 11 for snap-fixing the terminal board 1 in a known way, not illustrated for simplicity, to a support member.

From what has been described the advantages of the invention are apparent; the described integrated terminal board 1 is in fact capable of being produced in a very simple and economic manner and is of small size; at the same time it is able to receive, from opposite sides, plugs and wiring upon the connectors 23 and a control device of any shape and dimension within a predetermined range, such as, for example, a thermostat, upon the terminals 20 upon the side of the face 4, without the necessity of introducing any modifications to the integrated terminal board 1 itself; finally it is also able to perform the functions of a lamp-holder member as a result of the presence of the sleeve 8 and the perforations 10, and the support member for the push rod switch for controlling the lamp, which can be provided with respective lateral projecting shoes which can then be slidably inserted into the slots 30, whilst the slot 31 makes it possible to obtain, by means of the contacts 35, electrical connection with the circuitry defined by means of the sheet 6, the wall 33 functioning as a shoulder element for the biasing spring of the switch stem.

Obviously, many modifications and variations of the present invention are possible in light of the above teachings. It is therefore to be understood that within the scope of the appended claims, the present invention may be practiced otherwise than as specifically described herein.

I claim:

1. A lamp-holder terminal board, in particular for domestic electrical appliances, comprising:
   a plate-like body made of electrically insulating material, and having a peripheral edge and a pair of opposite lateral faces;
   an electrically conductive sheet, for defining an electrical circuit, embedded within said plate-like body between and parallel to said pair of opposite lateral faces;

lamp-holder means comprising a lamp-holder sleeve integrally formed with said plate-like body so as to project outwardly from said peripheral edge of said plate-like body;

means mounted upon said plate-like body for electrically interconnecting said electrically conductive sheet to a stem of a lamp to be accommodated within said lamp-holder sleeve; and a plurality of windows defined within at least one of said pair of lateral faces of said plate-like body so as to expose respective electrical terminals integrally disposed upon said electrically conductive sheet for permitting electrical connection of at least one electrical device to said terminal board.

2. A lamp-holder terminal board according to claim 1, characterised by the fact that said electrical terminals are each defined by respective inclined tongues punched from said conductive sheet and bent into a convergent V-shape.

3. A lamp-holder terminal board according to claim 1, characterised by the fact that said plate-like body has a peripheral edge having a substantially rectangular outline delimited by ribs standing out in relief from said faces.

4. A lamp-holder terminal board, according to claim 1, characterised by the fact that close to said sleeve there is formed a cable clamp device defined by a pair of oblique tongues each projecting into a respective oblique slot formed through said plate-like body in such a way that respective free ends of said tongues converge towards one another.

5. A lamp-holder terminal board according to claim 1, characterised by the fact that said plate-like body is provided upon the side opposite to said sleeve and projecting peripherally therefrom with a support device for electrical cables comprising at least one resiliently deformable half-ring having a circumferential extent greater than 180°.

6. A terminal board as set forth in claim 1, wherein: said lamp-holder sleeve is internally threaded for receiving a threaded portion of said stem of said lamp.

7. A terminal board as set forth in claim 1, wherein: said lamp-holder sleeve is disposed at a predetermined inclination with respect to peripheral edge portions of said terminal board.

8. A terminal board as set forth in claim 1, wherein: said plate-like body is fabricated from a synthetic plastic resin material.

9. A terminal board as set forth in claim 1, wherein: said electrically conductive sheet is fabricated from brass.

10. A terminal board as set forth in claim 1, wherein: said electrically conductive sheet is fabricated from copper.

11. A terminal board as set forth in claim 1, further comprising:
resiliently deformable tongues projecting laterally outwardly from opposite side edge portions of said plate-like body for facilitating snap-fitting engagement mounting of said terminal board upon a support member.

12. A terminal board as set forth in claim 1, further comprising:
perforation means defined within said terminal board and passing through said opposite lateral faces of said plate-like body at a position immediately adjacent a rear portion of said lamp-holder sleeve; and
said means for electrically interconnecting said conductive sheet to said stem of said lamp comprises at least one electrical terminal mounted upon said terminal board and projecting outwardly therefrom and into said perforation means so as to be engaged by said stem of said lamp when said lamp is mounted within said lamp-holder sleeve.

13. A terminal board as set forth in claim 12, wherein: said perforation means is disposed symmetrically with respect to a longitudinal axis of said lamp-holder sleeve.

14. A terminal board as set forth in claim 1, further comprising:
means for housing a slidable control means upon said terminal board which is slidably movable in a first direction under the influence of a closure of said domestic appliance so as to be maintained in a normally OPEN position when said closure is disposed in a CLOSED state whereby electrical power is not provided to said lamp, and which is slidably movable in a second opposite direction so as to be maintained in a CLOSED position when said closure of said domestic appliance is disposed in an OPEN state so as to provide electrical power to said lamp.

15. A lamp-holder terminal board according to claim 14, characterised by the fact that said housing for the slidable control means is defined by respective longitudinal T-shape slots disposed parallel to one another, passing through the terminal board in correspondence with said faces of the plate-like body; a first T-shape slot being formed with its first end, of greater width, in correspondence with a shoulder wall projecting laterally from said peripheral edge of the plate-like body; and a second said T-shape slot disposed laterally of the first T-shaped slot and longitudinally off-set with respect thereto and being internally provided with respective blade contacts formed integrally with said conductive sheet.

16. A terminal board as set forth in claim 15, wherein: said T-shaped slots are defined within a lower portion of said terminal board adjacent to a lower peripheral edge portion thereof.

17. A terminal board as set forth in claim 16, further comprising:
L-shaped blade connectors projecting laterally outwardly from a second one of said pair of lateral faces of said plate-like body along a peripheral edge portion of said plate-like body.

18. A lamp-holder terminal board according to claim 17, characterised by the fact that said L-shaped blade connectors are disposed in alignment side-by-side along an upper side of the said peripheral edge of said plate-like body, opposite and parallel to said T-shape slots, and project laterally from said plate-like body upon the side opposite the side from which said electrical terminals project.

* * * * *